Jan. 23, 1968 T. W. GADDY ET AL 3,365,675

POWER AMPLIFIER CONTROL AND PROTECTIVE CIRCUIT

Filed Jan. 4, 1965

INVENTORS:
ELLIOTT M. GILBERT,
THOMAS W. GADDY,

BY I. David Blumenfeld
THEIR ATTORNEY.

United States Patent Office 3,365,675
Patented Jan. 23, 1968

3,365,675
POWER AMPLIFIER CONTROL AND PROTECTIVE CIRCUIT

Thomas W. Gaddy, Evington, and Elliott M. Gilbert, Lynchburg, Va., assignors to General Electric Company, a corporation of New York Filed Jan. 4, 1965, Ser. No. 423,094
5 Claims. (Cl. 330—192)

Figure 1:
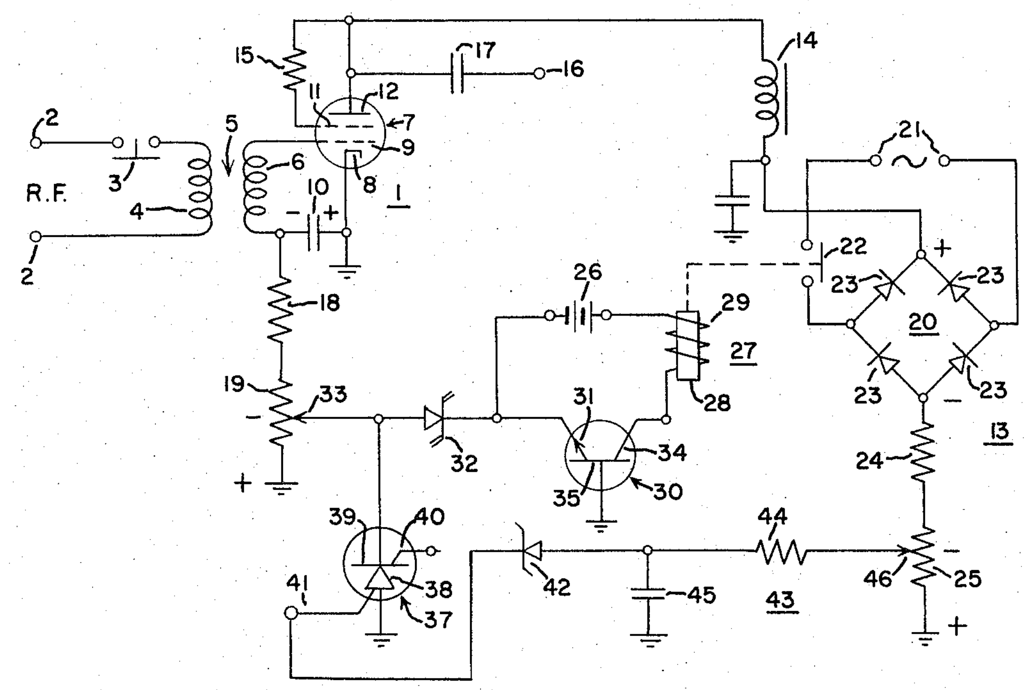

This invention relates to a protective circuit and, more particularly, to a protective circuit for a power amplifier.

The power amplifier stage of a high power transmitter may typically include a multielement vacuum tube such as a tetrode or a pentode. Power amplifier tubes, which are capable of handling substantial RF power levels, for example, levels of 50 watts or more, are expensive devices, and a great deal of care must be taken to prevent damage or destruction of the tube. Thus, some means must be provided to protect the power amplifier in the event of an overload condition which produces excessive anode current levels capable of damaging or destroying the tube. Such overload conditions may come about, for example, if the power amplifier load circuit, such as the antenna or other device, is accidentally disconnected from the amplifier. Multielement power amplifier tubes, such as tetrodes and pentodes, are also subject to damage or destruction if the RF drive signal is lost while the tube remains energized. Thus, some means must also be provided for sensing the loss of the RF grid drive and for disabling the power amplifier by disconnecting the anode supply voltage.

Hitherto, such protective functions for the power amplifier have been provided by the use of a plurality of sensing means which control a plurality of interlocked relays for removing the anode supply voltage. These systems are, however, complicated, bulky and expensive. Furthermore, not only is the cost high but by using electromechanical devices, such as relays, the system is less reliable in operation since relays have a smaller useful lifetime than solid-state devices which have no moving parts. A need exists, therefore, for a simplified protective arrangement, utilizing a minimum of electromechanical devices, which is capable of protecting the power amplifier of a high power transmitter against overload conditions and loss of RF drive signals.

It is, therefore, a primary object of this invention to provide a protective circuit for a tubed power amplifier stage which is simple in construction, inexpensive, and highly efficient in operation.

A further object of the invention is to provide a protective system for a power amplifier which is operative to protect the power amplifier tube in the event of an overload condition as well as a loss of grid drive which protective system utilizes a minimum of electromechanical devices.

Other objects and advantages of the invention will appear as the description thereof proceeds.

The various advantages and objects of the invention are realized by providing a power amplifier control and protective circuit in which an anode supply relay is controlled in response to the presence of an RF drive signal to the power amplifier. In addition, a solid-state disable switch for the relay control means is provided which is interlocked with the grid drive sensing circuit and is operated whenever the anode current exceeds a preset level to disable the anode supply. Consequently, the operation of the overload protective circuit, in response to an overload in the power amplifier circuit, removes the anode supply to prevent damage to the tube. The operator of the transmitter by operating the push-to-talk button of the microphone, for example, may then remove the RF grid drive to deenergize the overload protective circuit and then, by subsequently actuating the push-to-talk button, reapply the RF drive to determine whether the overload condition is still present or whether the condition causing the overload has disappeared so that the power amplifier may operate normally. By thus interlocking these various components, a simple, inexpensive, and highly effective overload protective system may be achieved.

Figure 2:
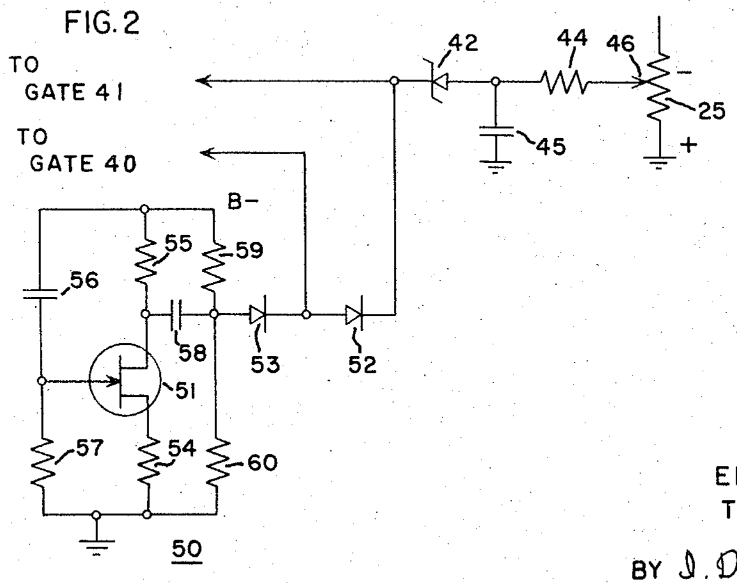

The novel features, which are believed to be characteristic of this invention, are set forth, with particularly, in the appended claims. The invention itself, both as to its organization and mode of operation, together with further objects and advantages thereof, may best be understood by reference to the following description taken in connection with the accompanying drawings in which:

FIG. 1 is a circuit diagram of the power amplifier control and protective system; and FIG. 2 is a fragmentary showing of an alternative construction of one portion of the circuit of FIG. 1.

FIG. 1 illustrates an overload protective system for a tubed power amplifier stage which may, for example, form part of a high power transmitter. The circuit is designed to protect the power amplifier against overload conditions which draw excessive anode current and against the loss of RF grid drive while the tube is energized. The RF drive signal for the power amplifier, shown generally at 1, is supplied from an RF driver or any other suitable source, not shown, and is impressed on input terminals 2 and thence through switch 3 to primary winding 4 of transformer 5. Secondary winding 6 is connected across the grid-cathode circuit of tetrode 7 which forms part of the power amplifier. Switch 3, in the transformer primary circuit, is provided in order to remove the RF drive from the power amplifier, but it will be obvious, however, that such a switch can be positioned anywhere and does not have to be in the power amplifier stage itself. In fact, in a high power transmitter, switch 3 need not be in the RF circuit directly but may be the push-to-talk switch of a microphone to permit the operator to apply or remove the RF exciter power supply selectively.

Tetrode 7 includes a cathode 8 connected directly to a point of reference potential such as ground, a control electrode 9 connected to the upper end of secondary winding 6, the lower terminal of which is connected to the cathode through the coupling capacitor 10, a screen grid 11 and an anode 12. Anode 12 is connected to a source of unidirectional voltage, shown generally at 13, through anode inductance or choke 14 to provide anode voltage for tetrode 7. Screen grid 11 is maintained at a lower positive potential than the anode through screen grid dropping resistor 15. The output from power amplifier 1 is applied to output terminal 16 through coupling capacitor 17. Output terminal 16 may be connected to any suitable utilization circuit such as the antenna of a transmitter, for example.

The power amplifier grid is connected to ground through the grid leak resistors 18 and 19 to provide a path for the grid current flowing in control grid 9 during positive alternations of the RF drive. The voltage developed across the grid leak voltage dividing resistors 18 and 19 provides, as will be explained in detail later, a means for determining whether the RF drive signal is present or not and to disable the anode voltage supply source in the event the RF drive disappears.

The anode voltage source for power amplifier 1 includes an AC voltage from any suitable source, not shown, and a rectifier bridge 20. The AC voltage is impressed on input terminal 21 connected, through a relay operated contact 22, across one diagonal of rectifier bridge 20. The rectifier bridge contains four arms, each of which includes one or more rectifying elements 23 which are so poled that a unidirectional voltage appears across the other diagonal of the bridge with the polarity shown. The positive terminal of the rectifier bridge is connected through choke 14 to anode 12 of the power amplifier, and the negative terminal of the bridge is returned to ground through the voltage divider comprising resistors 24 and 25. It may be seen from inspection that the unidirectional current flowing through resistors 18 and 19 is directly proportional to the power amplifier anode current which, as will be explained in detail later, may be utilized to sense any overload condition and to actuate the protective circuit.

The overload protective system for the power amplifier includes anode supply relay 27 which controls contact 22 in the anode voltage supply source circuit to selectively enable and disable the circuit. Anode supply relay 27 includes on armature 28, actuation of which controls contact 22, and relay winding 29 which is connected through a solid-state relay control switch 30 to a source of supply voltage represented by battery 26. Battery 26 is an ungrounded, floating relay supply with provides current for relay winding 29 whenever switch 30 is closed.

Relay control switch 30 is a NPN transistor having an emitter 31 connected through a voltage reference element, such as Zener diode 32, to slider 33 of grid leak resistor 19. Collector 34 is connected to the lower end of relay winding 29, and base 35 is connected directly to a point of reference potential such as ground. NPN transistor 30 is in the conducting state to energize relay winding 29 only if emitter 31 is more negative than base 35 so that the base-emitter junction is forward-biased. The base-emitter junction is forward-biased only if RF grid drive is provided for power amplifier 1. Only then is there sufficient grid current flowing to produce a voltage drop across resistors 18 and 19 which establishes a potential at slider 33 that is more negative than the sum of the Zener breakdown voltage and the reverse-bias on the base-emitter junction. Thus, relay 27 is actuated to close contact 22 and supply unidirectional anode voltage to power amplifier 1 only if a RF drive signal of sufficient magnitude is applied to the control grid of the power amplifier. It is obvious that the exact levels of RF drive signal, which must be present before the supply relay will be actuated, may be varied by adjusting the position of slider 33 by using Zeners having different breakdown voltages. Thus, an RF drive signal for the power amplifier, one which is of the requisite magnitude, drives relay control switch 30 into conduction and actuates anode supply relay 27. Actuation of relay 27 closes contact 22 and enables the voltage supply circuit to provide anode voltage for the power amplifier.

There is also provided a control circuit for disabling relay control switch 30 and relay 27 whenever an overload condition exists in the power amplifier circuit, and the overload condition is manifested by excessive anode current. To this end, a solid-state disable switch 37 is provided for relay control switch 30 to inactivate it and the relay when the anode current becomes excessive. Disable switch 37 is a silicon-controlled semiconductor switch (SCS) which includes an anode 38, connected to ground, and a cathode 39 connected to the junction of slider 33 and Zener 32, and a pair of gating electrodes 40 and 41. Gate electrode 41 drives disable switch 37 into conduction upon application of a negative gating current whereas application of a positive gating current to gate 40 would disable the switch. In the instant case, only gate 41 is utilized to drive the switch into the conducting state in response to a control signal proportional to the power amplifier anode current. The gating current is supplied to gate electrode 41 through a voltage reference device, such as Zener diode 42, and a time delay circuit 43 consisting of resistor 44 and a capacitor 45.

The control signal is taken from slider 46 associated with anode current sensing resistor 25. Since resistors 24 and 25 provide a return path to ground for the anode DC supply the voltage at slider 46 is directly proportional to the power amplifier anode current. By suitably positioning the slider 46 and by selecting Zener diode 42 to have a predetermined reverse breakdown voltage, the current level at which the disable switch will actuate the overload protective circuit may be established. Whenever the anode current exceeds the predetermined level, the negative voltage at slider 46 exceeds the reverse breakdown of Zener diode 42, and the diode begins to conduct, and a negative gating current is supplied to gate electrode 41. Silicon control switch 37 is driven into heavy conduction, and its cathode-to-anode impedance drops to a very low value and thereby clamps the junction or slider 33 of Zener 32 essentially to ground potential. Zener diode 32 stops conducting, reverse-biasing the base-emitter junction and driving the transistor into cut-off. Opening of relay control switch 30 deenergizes anode supply relay 27 which opens contact 22. The AC voltage to bridge 20 is removed disabling the power amplifier anode supply voltage.

The time delay circuit 43 is an RC integrating circuit and is provided to prevent the overload protective circuit from being actuated by very transient overload conditions. That is, from time to time, a transient overload may occur which is of such short duration that it will not damage the amplifier, and, hence, it is undesirable to disable the anode supply. The integrating circuit provides sufficient time delay for the control signal to make sure that silicon-control switch 37 is actuated only if the overload condition persists for a predetermined time period, a time period which is sufficienty long to constitute a threat to the power amplifier if the anode supply is not removed.

The silicon-control switch is a four-element semiconductor device and consists of an PNP device having an anode electrode, a cathode electrode and two intermediate electrodes which may be utilized as gating electrodes. The silicon-control switch is in many ways similar to a silicon-controlled rectifier (SCR), except that it has both a gate turn-on and a gate turn-off characteristic. A further difference between the devices is that the silicon-control switch may be turned on by a negative gating current whereas silicon-controlled rectifiers may be turned on only with positive gating current. A further difference, although this is not utilized in the instant embodiment, is that the silicon-control switch may be turned off by means of a further gating signal. In a silicon-controlled rectifier, on the other hand, the gate loses control once the device is driven into the conducting state, and conduction can be terminated only by interrupting or reversing the polarity of the anode-cathode supply voltage.

For greater details about this construction and operation of silicon-controlled switches and silicon-controlled rectifiers, reference is hereby made to the General Electric, "Silicon-Controlled Rectifier Manual," Seventh Edition, 1964, published by the General Electric Company, Syracuse, N.Y., and particularly pages 391–435.

SCS are also described and discussed in detail in Application Note 90.16, published June 1964, by the Semiconductor Products Department of the General Electric Company, Syracuse, N.Y.

The manner in which the overload protective circuit, illustrated in FIG. 1, operates is as follows:

Whenever the transmitter, including power amplifier 1, is first energized, RF is supplied through closure of a switch such as switch 3 or the push-to-talk switch on the microphone, not shown, or by any remote manually operated switch. The RF drive signal is impressed on the input transformer and to control grid 9 of the power amplifier. At this point in time, anode supply relay 27 is deenergized, and switch 22 is open and no anode voltage is applied to the anode of the power amplifier. During the positive alternation of the RF signal, grid 9 is positive with respect to its cathode, and electrons flow from the cathode to grid 9, through winding 6, and through grid leak resistors 18 and 19 to ground establishing a voltage drop across resistor 19 with the polarity shown. Capacitor 10, which is also connected in parallel with the grid leak resistors, charges up to the polarity shown, and during negative alternations of the RF maintains the voltage across the grid leak resistors. If the amplitude of the RF grid drive is at or above the desired level, the negative voltage at slider 33 is greater than the sum of the reverse breakdown voltage of the Zener and the base-emitter reverse-bias of transistor 30. Zener diode 32, therefore, conducts and a negative voltage is applied to emitter 31 which is of sufficient magnitude to forward-bias the base-emitter junction driving transistor 30 into conduction. When transistor relay control switch 30 conducts, a circuit is completed between winding 29 and battery 26 through the collector-emitter path of transistor 30. Winding 29 is energized actuating its armature and closing contact 22 to apply AC voltage to bridge 20. The rectified voltage from bridge 20 is applied to the anode of power amplifier 1.

If the RF drive disappears or drops to a value below a predetermined level, the negative voltage at slider 33 goes to zero or is reduced sufficiently so that it no longer exceeds the reverse breakdown voltage of Zener 32, and Zener 32 ceases to conduct. The potential at emitter 31 drops essentially to ground, and the emitter base junction of the transistor is no longer forward-biased, driving the transistor into cut-off. The flow of energizing current to relay winding 29 is interrupted deenergizing the relay and opening contact 22 in the supply lead to rectifying bridge 20. This, of course, removes the supply voltage for the tube, disabling the amplifier and preventing damage to tetrode 7. It can be seen that the protective system automatically removes the supply voltage for the power amplifier in the event that the RF drive fails or is reduced below a predetermined level thereby protecting the power amplifier against damage.

As long as the RF drive signal is present and as long as there is no overload condition which results in excessive anode current flow, the overload circuit is inactive, and relay control switch 30 is actuated to energize the supply relay. If, however, a condition occurs which produces an excessive anode current flow in power amplifier 1, as might be the case for example, if the antenna load in the power amplifier were lost, the anode current increases, and the current flowing through resistances 25 and 24 slider 46 and the grounded end of resistor 25 varies proportionally so that the voltage at slider 46 becomes more negative as the current increases. If the anode current increases beyond a predetermined level, the negative voltage at slider 46 is sufficiently large to exceed the reverse breakdown voltage of Zener diode 42 driving that diode into conduction and supplying a negative gating current to gate 41 of switch 37. This negative gating current drives silicon-control switch 37 into full conduction.

When silicon-control switch 37 is driven into conduction, its cathode-to-anode resistance becomes exceedingly low, and the junction of slider 33 and the anode of Zener 32 is essentially clamped to ground potential. As this point is clamped to ground potential, emitter 31 of transistor relay control switch 30 is no longer more negative than base 35, and the base-emitter junction is instantly reverse-biased. This stops conduction of transistor 30, thereby interrupting the current flow to relay winding 29 deenergizing the relay and opening contact 22. Voltage supply source 13 is disabled, and the power amplifier anode voltage is removed. Once silicon-controlled disable switch 37 is driven into conduction by an overload condition, it remains in that state and the voltage supply for the power amplifier remains disabled. That is, silicon-controlled switches once triggered into conduction remain in the conducting state either until a turn-off pulse is applied to gate electrode 41 or the anode-cathode supply voltage is removed. Hence, switch 37 maintains the base supply relay deenergized until the RF drive is removed and reapplied, or a turn-off pulse is applied either manually or by an automatic timing system presently to be described. The operator of the transmitter, upon noting that he is receiving no reply to his message or upon noting that the power amplifier is not operating, which may be done by means of a light or indicator which is actuated whenever the anode supply is disabled, releases the push-to-talk key which removes the RF supply from the power amplifier. The removal of the RF drive in the power amplifier terminates the grid leak current flowing through resistors 18 and 19 so that the potential slider 33 now goes to ground thereby removing the anode-cathode supply voltage for disable switch 37 thereby terminating conduction. The operator then again actuates the push-to-talk switch, reapplying the RF drive. Grid current through resistors 18 and 19 establishes the proper voltage to actuate relay control switch transistor 30 and supply relay 27 to apply anode voltage to the power amplifier, and energizing voltage is also now provided for disable switch 37. If the overload condition is still present so that excessive current still flows through resistors 24 and 25, switch 37 is once again actuated, cutting off relay control switch transistor 30 and once again disabling the power supply. Thus, as the operator keys the transmitter a number of times, applying and removing RF, continuing failure of the transmitter and power amplifier to operate, which is indicated to the operator by an indicating light, establishes that an overload condition exists in the power amplifier stage and that the overload protective system is continuously operating. This, of course, indicates to the operator that the condition is persistent and that maintenance and repair of the transmitter unit is called for.

It will be seen, therefore, that a simple overload protective system for a power amplifier stage of a transmitter is provided which utilizes but a single electromechanical relay element and which protects the power amplifier against an overload condition which results in the amplifier drawing excessive anode current and against the loss of RF drive both of which conditions, if not checked, can result in damage or destruction of an expensive power amplifier stage. The system is further characterized by the fact that the overload and RF drive sensing circuit is operatively interlocked in that the disable switch for the anode supply relay switch obtains its supply voltage if the RF drive for the amplifier is present. Thus, there is positive interlocking of all of the elements of the voltage protective system to produce a simple and effective arrangement. By interlocking the system, a further advantage is gained in that the silicon-controlled switch, which disables the supply relay, does not require a separate power supply of its own, thus simplifying the arrangement and minimizing its cost.

Under certain circumstances, it may be useful to provide an automatic timing arrangement for the overload circuitry to turn off disable switch 37 periodically and to determine whether the overload condition still exists. FIG. 2 illustrates such a timing arrangement which may be incorporated in the circuit of FIG. 1. A pulse generator 50 is provided to generate positive turn off pulses which are coupled through diode 53 to gate 40. These output pulses are applied to gate 40 only if the anode current exceeds the predetermined level and the protective circuit has been actuated, and disable switch 37 is conducting. To this end, a further diode 52 is coupled between Zener 42 and the cathode of diode 53. Diode 52 conducts whenever the negative voltage at slider 46 on resistor 25 is sufficiently large to exceed the Zener reverse breakdown voltage. When diode 52 conducts, its resistance is extremely low and clamps the cathode of diode 53 to a negative voltage, the anode of which is slightly negative with respect to ground by virtue of the voltage divider consisting of resistors 59 and 60. This forward-biased diode 53 and passes the positive pulses to gate 40 to turn switch 37 off. This disables the protective circuit and reapplies anode voltage to the power amplifier. If the overload condition still persists, the protective circuit again removes the supply voltage. The timing circuit will continue to operate and test the power amplifier conditions at rates determined by the repetition frequency of pulse generator 50 until the operator disables the system by removing the RF excitation.

Pulse generator 50 is a relaxation oscillator in which a unijunction transistor 51, having an emitter electrode and a pair of base electrodes, is utilized as a discharge device. The base electrodes are connected through base resistors 55 and 54 to the B— and grounded buses. An RC time constant network establishes the repetition rate of the pulses by controlling the voltage level at the emitter and, hence, the rate at which the unijunction transistor is driven into conduction. The RC network includes storage capacitor 56 connected between the emitter and the B— bus and a charging resistor 57 connected between the emitter and ground. Storage capacitor 56 charges through resistor 57 from B— toward the relatively positive ground potential. The voltage at the emitter rises from B— toward ground as the capacitor charges. When the voltage reaches a predetermined value, depending on the nature and characteristics of the unijunction transistor, the emitter junction becomes forward-biased, and unijunction transistor 51 conducts, rapidly discharging capacitor 46. This rapid discharge produces an instantaneous current flow through base resistor 55, and a short positive voltage impulse is produced at the base which is applied through coupling capacitor 58 to diode 53. After the capacitor has discharged, the emitter junction is again reverse-biased, and the capacitors again begin to charge through resistor 57 towards ground. This cycle is repeated when the voltage at the junction of the capacitor and resistor again reaches a value which forward-biases the unijunction emitter.

Unijunction transistor 51 is a three terminal semiconductor device having two ohmic contacts, the bases, at opposite ends of a small bar of N type silicon. A single rectifying contact, the emitter, is made on the opposite side of the bar close to the upper base. An interbase resistance of somewhere between five and ten thousand ohms exists between bases. With no emitter current flowing, i.e., with the rectifying emitter junction reverse-biased, the silicon bar between the base acts like a simple voltage divider, and a certain fraction $\eta$ of the voltage $V_{BB}|(B+-B-)|$ between the two bases appears at the emitter. If the externally applied emitter voltage is less than (i.e., more negative) this fraction $\eta V_{BB}$ (customarily referred to as the intrinsic stand-off ratio), the emitter is reverse-biased and only a small emitter leakage current flows. If the externally applied emitter voltage exceeds $\eta V_{BB}$, the emitter is forward-biased and emitter current flows. This emitter current consists primarily of holes injected into the silicon bar. These holes move down the bar from the emitter to the upper base and result in an equal increase in the number of electrons in the emitter to upper base region. The net result is a decrease in resistance between emitter and the upper base so that, as the emitter current increases, the emitter voltage decreases, and a negative resistance characteristic is obtained rapidly discharging the storage capacitors.

Generator 50 is thus seen to be a relaxation oscillator in that the RC network periodically drives transistor 51 into conduction which, in turn, discharges the capacitors and reduces the emitter voltage so that the cycle starts again. The period of the relaxation oscillations, and hence the pulse repetition frequency, is controlled by the RC network, the intrinsic stand-off ratio of the unijunction, and the magnitude of the base voltage $V_{BB}$ is applied across the bases of unijunction transistor 51.

Although a number of specific embodiments of the invention have been shown, it will, of course, be understood that the invention is not limited thereto since many modifications, both in the instrumentality and circuit arrangement employed, may be made. It is contemplated by the appended claims to cover any such modifications which fall within the true scope and spirit of this invention.

What is claimed as new and desired to be secured by Letters Patent of the United States is:

1. In a circuit for protecting a power amplifier against damage and destruction due to current overload conditions and loss of RF drive, the combination comprising:

(1) a power amplifier having at least input, output and common electrodes, said input electrode being adapted to have an RF signal impressed thereon;

(2) a supply source coupled to said amplifier for providing operation voltage for said amplifier;

(3) means for disabling said supply source and removing energizing voltage from said amplifier, including relay means and relay operated contact means in said supply source;

(a) solid state relay control switch means connected in series with said relay to control energization thereof;

(b) resistive means coupled to said power amplifier input electrode for producing a voltage in response to RF drive signal impressed on said input electrode;

(c) means coupling said relay control switch to said resistive means to close said switch and energize said relay for enabling said supply source and applying operating voltage to said power amplifier only if RF drive is present;

(4) a disabling switch means for said relay control switch to disable said relay switch and de-energize said relay in response to an amplifier overload condition, including;

(a) a controlled switch device having an output, a common and at least one control electrode, the output electrode of said switch being connected to said resistive means whereby energizing potential for said controlled switch is provided only if RF grid drive is present;

(b) means to generate a control signal in response to the load current drawn by said amplifier;

(c) means to apply the control signal to said control electrode whenever the load current and the control voltage exceeds a predetermined level for driving said controlled switch into conduction and disabling said relay switch;

whereby said supply source is disabled whenever excessive load current is drawn or the RF drive fails or is reduced excessively.

2. The protective circuit, according to claim 1, wherein said controlled switch consists of a gated solid-state unidirectional conducting device.

3. The protective circuit, according to claim 1, wherein said controlled switch consists of a silicon-controlled rectifying device, the cathode of which is connected to said resistance means and the anode to a point of reference potential whereby conduction of said rectifier, in response to a control signal applied to the gating electrode, clamps the relay switch to the reference potential thereby disabling it.

4. The protective circuit, according to claim 3, wherein said means to apply the control signal to the gate electrode includes a voltage reference so that the silicon-controlled rectifier is driven into conduction only if the control signal exceeds a predetermined level.

5. The protective circuit, according to claim 4, wherein said silicon-controlled rectifying device included a further gating electrode capable of driving said switch into the nonconducting state, and pulse means also responsive to said control signal for applying control pulses to said further electrode to drive the switch back into the nonconducting state to determine where the excessive load current condition persists.

No references cited.

ROY LAKE, *Primary Examiner.*

E. C. FOLSOM, *Assistant Examiner.*